(12) United States Patent
Nguyen et al.

(10) Patent No.: US 9,103,876 B2
(45) Date of Patent: Aug. 11, 2015

(54) AUTOMATIC PROBE CONFIGURATION STATION AND METHOD THEREFOR

(75) Inventors: Kent Nguyen, San Jose, CA (US); Kaushal Gangakhedkar, San Jose, CA (US); David Baldwin, Atascadero, CA (US); Nile Light, Livermore, CA (US); Steve Aochi, Morgan Hill, CA (US); Yan Wang, Sunnyvale, CA (US); Atila Ersahin, Fremont, CA (US); Hai Tran, San Jose, CA (US); Thomas H. Bailey, San Jose, CA (US); Kiran Jitendra, San Jose, CA (US); Alan Cable, San Jose, CA (US); Dave Smiley, San Jose, CA (US); Thomas E. Wishard, Santa Cruz, CA (US)

(73) Assignee: PHOTON DYNAMICS, INC., San Jose, CA (US)

( * ) Notice: Subject to any disclaimer, the term of this patent is extended or adjusted under 35 U.S.C. 154(b) by 393 days.

(21) Appl. No.: 13/521,034

(22) PCT Filed: Jan. 7, 2011

(86) PCT No.: PCT/US2011/020553
§ 371 (c)(1),
(2), (4) Date: Jul. 6, 2012

(87) PCT Pub. No.: WO2011/085227
PCT Pub. Date: Jul. 14, 2011

(65) Prior Publication Data
US 2012/0319713 A1    Dec. 20, 2012

Related U.S. Application Data

(60) Provisional application No. 61/293,610, filed on Jan. 8, 2010.

(51) Int. Cl.
*G01R 31/28*    (2006.01)

(52) U.S. Cl.
CPC .................. *G01R 31/2893* (2013.01)

(58) Field of Classification Search
CPC .................. G01R 31/2808; G01R 31/2893
See application file for complete search history.

(56) References Cited

U.S. PATENT DOCUMENTS 7,131,372 B2 * 11/2006 Lyons ............................ 101/42
7,245,142 B2 *  7/2007 Tanaka et al. ............. 324/750.22

(Continued)

FOREIGN PATENT DOCUMENTS

| JP | 10-253716 A     | 9/1998 |
| JP | 2002-277510 A   | 9/2002 |
| KR | 10-2005-0082084 A | 8/2005 |

(Continued)

OTHER PUBLICATIONS

International Search Report and Written Opinion of the International Searching Authority for International Application No. PCT/US2011/020553 dated Jul. 28, 2011.

*Primary Examiner* — Arleen M Vazquez
*Assistant Examiner* — Feba Pothen
(74) *Attorney, Agent, or Firm* — TransPacific Law Group; Pavel I. Pogodin, Esq.

(57) ABSTRACT

A probe system for facilitating the inspection of a device under test. System incorporates a storage rack; a probe bar gantry assembly; a probe assembly configured to electrically mate the device under test; and a robot system for picking the probe assembly from the storage rack and deliver the probe assembly to the probe bar gantry. The robot system is also enabled to pick a probe assembly from the probe bar gantry and deliver the probe assembly to the storage rack. The probe assembly includes a clamping assembly for attaching the probe assembly to the probe bar gantry or the storage rack. The probe assembly may include an array of contact pins configured to mate with conductive pads on the device under test when the probe assembly is installed on the probe bar gantry assembly.

27 Claims, 10 Drawing Sheets

(56) References Cited

U.S. PATENT DOCUMENTS

| | | | |
|---|---|---|---|
| 7,609,053 B2 * | 10/2009 | Hsu et al. | 324/757.03 |
| 8,513,962 B2 * | 8/2013 | Kiyokawa et al. | 324/750.2 |
| 2003/0086822 A1 | 5/2003 | Turner et al. | |
| 2004/0071888 A1 | 4/2004 | Chondroudis et al. | |

FOREIGN PATENT DOCUMENTS

| | | |
|---|---|---|
| KR | 10-2006-0086162 A | 7/2006 |

* cited by examiner

AUTOMATIC PROBE CONFIGURATION STATION AND METHOD THEREFOR

CROSS-REFERENCE TO RELATED APPLICATIONS

The present application is related to and claims benefit of priority from U.S. Provisional Patent Application No. 61/293, 610 filed on Jan. 8, 2010, the entire disclosure of which is incorporated by reference herein.

BACKGROUND OF THE INVENTION

1. Field of the Invention

The present invention relates generally to the field of electrical inspection of large scale electronic devices and in particular to inspection of Liquid Crystal (LC) and Organic Light Emitting Diode (OLED) displays, and the optical and electronic systems used in this inspection.

2. Description of the Related Art

Liquid crystal display (LCD) panels incorporate liquid crystals that exhibit electric-field dependent light modulating properties. They are used most frequently to display images and other information in a variety of devices ranging from fax machines, laptop computer screens, to large screen, high-definition TVs. Active matrix LCD panels are complex layered structures consisting of several functional layers: a polarizing film; a TFT glass substrate incorporating thin-film transistors, storage capacitors, pixel electrodes and interconnect wiring a color filter glass substrate incorporating a black matrix and a color filter array and a transparent common electrode; an orientation film made of polyimide; and the actual liquid crystal material incorporating plastic/glass spacers to maintain proper LCD cell thickness.

LCD panels are manufactured under highly controlled conditions in a clean room environment to maximize yield. Nonetheless, many LCDs have to be discarded because of manufacturing flaws.

As stated above, in order to improve production yield of complex electronic devices, such as LCD panels, various inspection stages are performed in order to identify various defects that can occur during various stages of the fabrication process. The aforesaid inspection stages may be performed between the fabrication stages or after the completion of the entire fabrication process. One example of the aforesaid inspection process is the testing of TFT arrays used in LC and OLED displays for electrical defects. Various inspection devices are used to perform the aforesaid testing. Exemplary devices that could be used for this purpose include Array Checker AC5080 commercially available from Orbotech Ltd. of San Jose, Calif., USA. Alternatively, the TFT array testing may be performed using electron-beam inspection systems known to persons of skill in the art and commercially available.

Electrical inspection systems in general require the device under test (DUT) to be driven with electrical signals, or patterns, that facilitate the detection of defects. These signals are conveyed from a pattern generator subsystem to the DUT by means of a structure carrying probe pins that physically touch contact pads located at the periphery of the active area of the DUT. In the case of the electrical inspection of TFT arrays, one or more shorting bars (implemented on the same substrate as the array) are often disposed between the contact pads used for array test and the panel drive lines. These shorting bars are connected to a subset of drive lines (e.g., one shorting bar may be connected to every other gate line), thereby reducing the number of contacts needed, which simplified the probing assembly.

Different devices will in general have different test pad layouts. The test pad layout may depend on the size of the DUT, the distance between adjacent devices to be tested on the same substrate, the orientation of the DUT on the substrate and other factors. If different devices are to be tested on the same electrical inspection system, the probing structure must therefore be modified to conform to the configuration of the DUT. Currently, this reconfiguration of the probing structure is accomplished using a procedure which involves intensive manual labor. For example, in electrical inspection systems using manually configured probing structures, a machine operator is required to install, calibrate, and configure a new probing structure when a different circuit layout is to be tested. This process requires the testing machine to be taken down for extended periods of time, resulting in decreased machine utilization. For processes that require a process control chamber, the operator would be required to enter the chamber to perform the reconfiguration, which could result in further machine downtime while the chamber is brought back to process conditions and may expose the operator to safety hazards.

In the event that a new panel layout is to be tested, a customized probing structure must be developed at additional cost to the customer. The probing structures not being used are stored outside of the machine, which requires additional floor space for storage.

SUMMARY OF THE INVENTION

The inventive methodology is directed to methods and systems that substantially obviate one or more of the above and other problems associated with conventional techniques for facilitating inspection of large scale electronic devices.

In accordance with one aspect of the present invention, there is provided a probe system for inspection of a device under test. The probe system incorporates a storage rack; a probe bar gantry assembly; a probe assembly configured to electrically mate the device under test; and a robot system configured to pick the probe assembly from the storage rack and deliver the probe assembly to the probe bar gantry. The robot system is further configured to pick a probe assembly from the probe bar gantry and deliver the probe assembly to the storage rack.

Various embodiments include the probe assembly incorporating a clamping assembly configured to attach the probe assembly to the probe bar gantry or the storage rack.

Various embodiments include the probe assembly incorporating an array of contact pins configured to mate with conductive pads on the device under test when the probe assembly is installed on the probe bar gantry assembly.

Various embodiments include the probe assembly incorporating a contact assembly comprising multiple contacts. The probe bar gantry assembly incorporates a gantry structure and an electrical bus mounted on the gantry structure, the electrical bus includes multiple traces and the multiple contacts of the contact assembly are configured to electrically mate with the plurality of traces of the electrical bus when the probe assembly is installed on the probe bar gantry assembly.

Various embodiments include a controller configured to detect a predetermined probe assembly on the electrical bus.

Various embodiments include a controller configured to verify presence of correct probe assemblies in the electrical bus and identify any misplaces probe assemblies.

Various embodiments include a test pattern generator configured to generate an electrical test pattern for the device under test. The aforesaid test pattern generator is electrically connected to the electrical bus of the probe bar gantry assembly such that the electrical test pattern is applied to at least one of the plurality of contacts of the contact assembly through the traces of the electrical bus.

Various embodiments include a probe assembly configured to receive the test pattern from the electrical bus through the contact assembly and to apply the electrical test pattern to the device under test through the array of contact pins.

Various embodiments include multiple traces of the electrical bus that are arranged along the length of the probe bar gantry assembly such that multiple contacts of the contact assembly of the probe assembly mate with multiple traces of the electrical bus when the probe assembly is installed anywhere along the length of the probe bar gantry assembly.

Various embodiments include the probe bar gantry configured to provide an automated axis of motion for positioning the probe assembly at a specific location on the device under test.

Various embodiments include a robot system incorporating a gripping assembly operable to grab the probe assembly.

Various embodiments include the gripping assembly incorporating a gripping arm pivotally movable in relation to the gripping device and the robot system incorporating an actuator for actuating the gripping arm of the gripping assembly.

Various embodiments include the gripping assembly operable to cause the clamping assembly of the probe assembly to open and release the storage rack or the probe bar gantry assembly when the probe assembly is grabbed by the gripping assembly.

Various embodiments include the robot system incorporating at least one sensor configured to identify and locate probe assemblies.

Various embodiments include the sensor, which is an RFID reader. The probe assembly includes an RFID tag configured to be read by the RFID reader and the RFID tag stores at least one of: a unique probe assembly identifier, probe type information, and calibration information.

Various embodiments include the sensor, which is an edge detection sensor configured to detect an edge of the probe assembly.

Various embodiments include a controller configured to determine corrections necessary for compensating for any distortion of the probe bar gantry assembly surface during placement or removal of the probe assembly.

Various embodiments include the probe assembly having an array of contact pins configured to mate with conductive pads on the device under test, a contact assembly having multiple contacts and a probe assembly controller configured to route one or more signals from one or more of the multiple contacts to one or more contact pins.

Various embodiments include a probe assembly controller having a serial protocol interface coupled to the contact assembly, the contact assembly being configured to electrically mate with an electrical bus of the probe bar gantry assembly, such that the serial protocol interface is controllable through the electrical bus of the probe bar gantry assembly using a serial protocol.

Various embodiments include a probe assembly controller server operable to send serial protocol commands to the serial protocol interface of the probe assembly through the electrical bus.

Various embodiments include multiple test pattern generators configured to generate multiple groups of electrical test pattern signals for the device under test. The contact assembly is configured to electrically mate with an electrical bus of the probe bar gantry assembly, and the plurality of groups of electrical test pattern signals are applied to the electrical bus. The probe assembly controller is configured to route one of the multiple groups of electrical test pattern signals to the multiple contact pins.

Various embodiments include the probe assembly controller configured to route one or more sensed signals from the device under test from one or more contact pins to one or more of the multiple contacts of the contact assembly.

Various embodiments include the probe assembly controller of the probe assembly having a memory device storing a unique identifier of the probe assembly and where the unique identifier of the probe assembly is used to send commands to the probe assembly controller.

Various embodiments include the probe assembly controller configured to route a signal from any one of the multiple contacts to any one of the multiple contact pins.

Various embodiments include the contact pins of the probe assembly that are pre-positioned according to a configuration of a predetermined device under test.

Various embodiments include the probe assembly having at least one of: an optical probing device, an electrical probing device, a thermal probing device and an alignment probing device.

Various embodiments include the probe bar gantry assembly operable to position the probe assembly anywhere on the device under test.

In accordance with another aspect of the present invention, there is provided a probe system for inspection of a device under test. The probe system incorporates a storage rack having a first rail; a probe bar gantry assembly having gantry structure and an electrical bus attached to the gantry structure and having a multiple traces, the gantry structure having a second rail. The probe system further incorporates a probe assembly having a plurality of pins configured to electrically mate contact pads on the device under test, multiple contacts configured to mate the traces of the electrical bus when the probe assembly is positioned on the probe bar gantry assembly and a clamping assembly configured to engage the first rails and second rails. The probe system further incorporates a robot system configured to pick the probe assembly from the storage rack and deliver the probe assembly to the probe bar gantry, and to pick a probe assembly from the probe bar gantry and deliver the probe assembly to the storage rack.

In accordance with yet another aspect of the present invention, there is provided a system incorporating: a storage rack; a first gantry assembly; a second gantry assembly; an access area enabling access to the first gantry assembly; a first robot system; and a second robot system. The second robot system is configured to reposition the payload among any of the storage rack, the first gantry assembly and the second gantry assembly. The second robot system incorporates at least one edge detection sensor configured to identify and locate the payload by detecting at least one edge of the payload.

Additional aspects related to the invention will be set forth in part in the description which follows, and in part will be obvious from the description, or may be learned by practice of the invention. Aspects of the invention may be realized and attained by means of the elements and combinations of various elements and aspects particularly pointed out in the following detailed description and the appended claims.

It is to be understood that both the foregoing and the following descriptions are exemplary and explanatory only and are not intended to limit the claimed invention or application thereof in any manner whatsoever.

BRIEF DESCRIPTION OF THE DRAWINGS

The accompanying drawings, which are incorporated in and constitute a part of this specification exemplify the embodiments of the present invention and, together with the description, serve to explain and illustrate principles of the inventive technique. Specifically.

DETAILED DESCRIPTION

In the following detailed description, reference will be made to the accompanying drawing(s), in which identical functional elements are designated with like numerals. The aforementioned accompanying drawings show by way of illustration, and not by way of limitation, specific embodiments and implementations consistent with principles of the present invention. These implementations are described in sufficient detail to enable those skilled in the art to practice the invention and it is to be understood that other implementations may be utilized and that structural changes and/or substitutions of various elements may be made without departing from the scope and spirit of present invention. The following detailed description is, therefore, not to be construed in a limited sense.

In accordance with one or more embodiments of the inventive concept, the current manual probing structure exchange procedure required when a different device (specifically a TFT array) is to be electrically tested—and the associated multiple probing structures—are replaced with a novel procedure and associated mechanism that can be used remotely (and automatically) to reconfigure probing structures according to the layout of the DUT.

Figure 1:
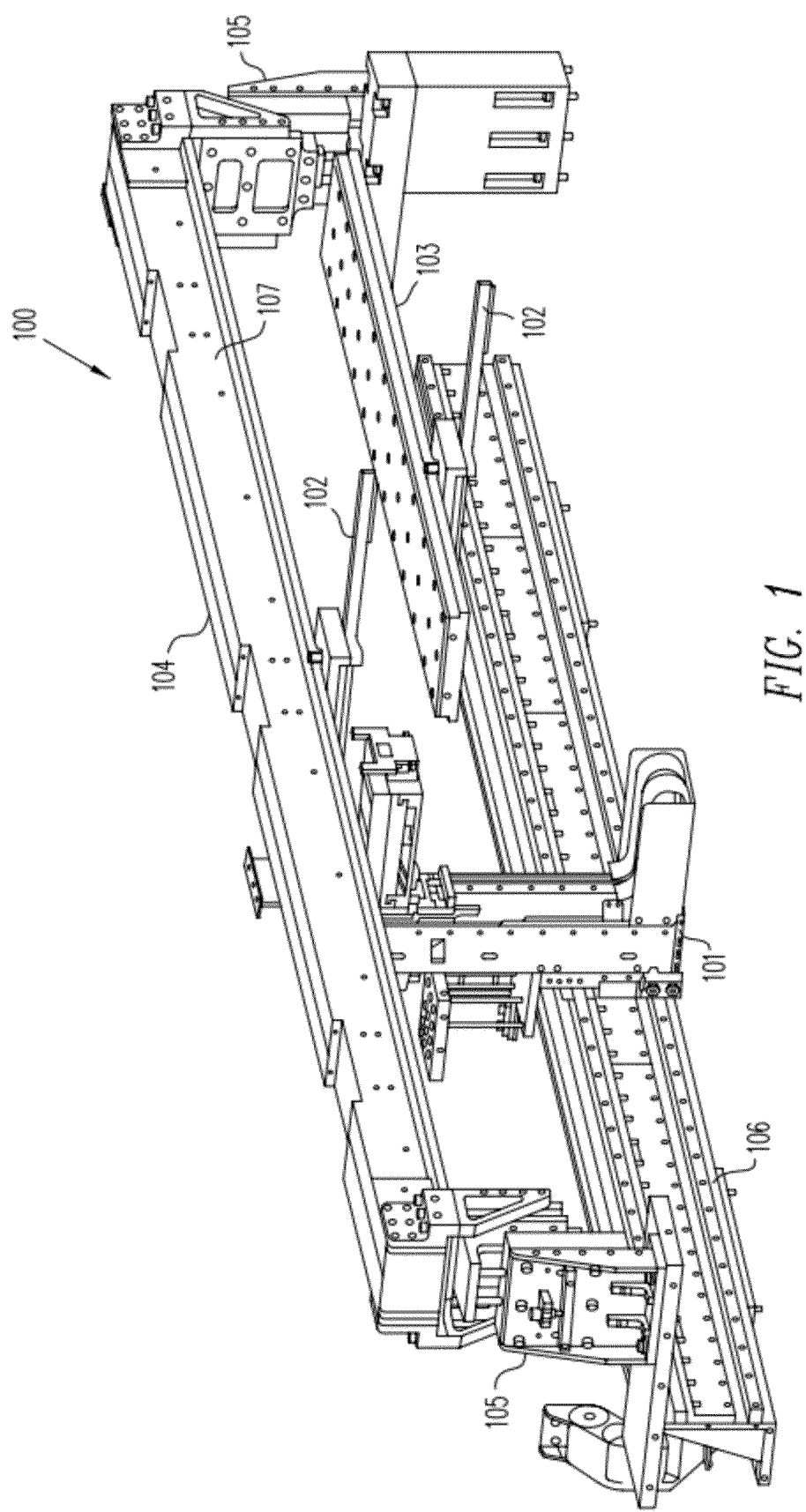
FIG. 1 provides a perspective view of a portion of an exemplary embodiment of the inventive probe configuration station (PCS) and its major components.

FIG. 1 illustrates an exemplary mechanical implementation 100 of the inventive Probe Configuration Station, in accordance with one or more embodiments of the present invention. As shown in FIG. 1, the PCS includes, in part, a pick and place robotic system (PCS robot) 100, one or more probe assemblies 102, a probe assembly storage rack 103, and a probe bar gantry 104, as shown in FIG. 1. The PCS robot 101 is used to move probe assemblies 102 between the probe bar gantry 104 and the probe assembly storage rack 103. In one or more embodiments, the probe assembly storage rack 103 incorporates at least one storage rack rail.

In one or more embodiment of the invention, the storage rack 103 is mounted on a support frame assembly 105 in a stationary manner with respect to the probe bar gantry 104, while the PCS robot 101 is movable on its track assembly 106 by means of a computer-controlled actuator (not shown in FIG. 1).

The probe assemblies 102 are customizable modules that provide a full array of contact pins designed for engaging signal receiving conductive pads on the DUT in order to drive the DUT during the electrical testing operation. In many cases, the aforesaid conductive pads are positioned on the periphery of the DUT. In case of the DUT being a TFT panel, the probe assemblies 102 may deliver the drive and/or data signals thereto in order to enable electrical testing operation.

In addition to the aforesaid contact pins, the probe assemblies may also include a clamping mechanism designed to position and reliably fix the probe assemblies on the probe bar gantry 104 and probe assembly storage rack 103. In one or more embodiments, the aforesaid clamping mechanism is configured to engage the rails or groves in the probe bar gantry 104 and probe assembly storage rack 103.

Figure 2:
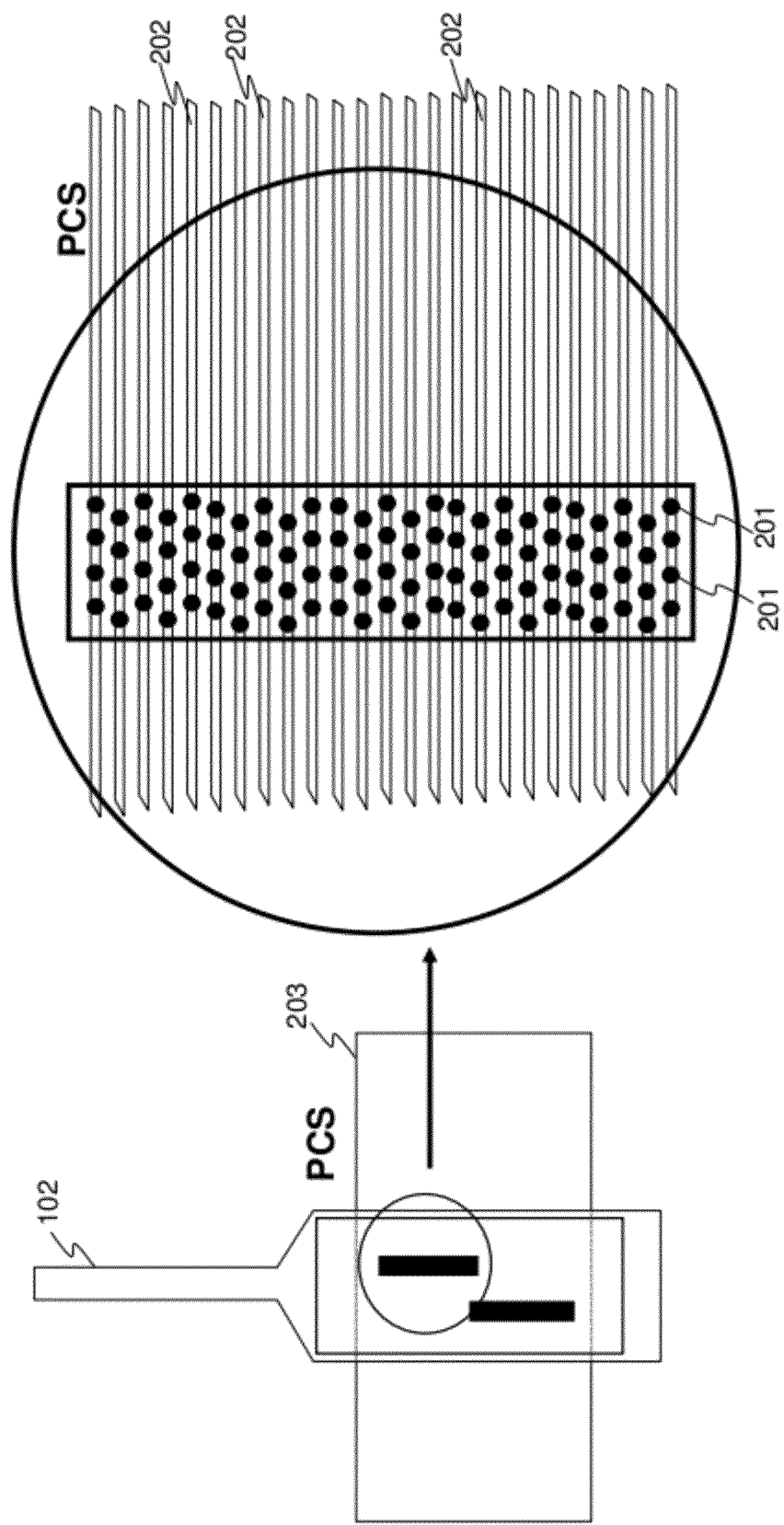
FIG. 2 illustrates an exemplary embodiment of the probe assembly with contacts mating against traces of a PCS bus.

The probe assemblies 102 may also include the support electronics configured to send and receive electrical signals from the aforesaid contact pins. This support electronics of the probe assemblies 102 is electrically connected to a set of electrical contacts, which are designed to electrically mate with a Probe Configuration Station bus, which is attached to the probe bar gantry 104. FIG. 2 illustrates the probe assembly 102 with contacts 201 mating traces 202 of the PCS bus 203. The aforesaid mating occurs when the probe assembly 102 is placed on the probe bar gantry 104.

In one or more embodiments of the invention, the PCS bus 203 is attached to the bottom side of the probe bar gantry 104 in such a manner that when the probe assemblies 102 are placed anywhere along the length of the probe bar gantry 104, the electrical connection is established between the PCS bus 203 and the electrical contacts 201 of the probe assemblies 102. To this end, the electrical traces 202 of the PCS bus 203 are arranged along the length of the probe bar gantry 104. In another embodiment of the invention, the PCS bus 203 may be attached to the top side of the probe bar gantry 104. In one or more embodiments of the inventive PCS, the PCS bus 203 is configured to supply the electrical power to the DUT via the probe assembly 102.

In accordance with one or more embodiments of the inventive concept, the probe bar gantry 104 provides an automated axis of motion that is used to position the probe assemblies 102 at specific locations along the length of the LCD glass in accordance with the configuration of the DUT. Finally, the storage rack 103 is used to store spare probe assemblies 102 or assemblies used for other DUT layouts.

Figure 3A:
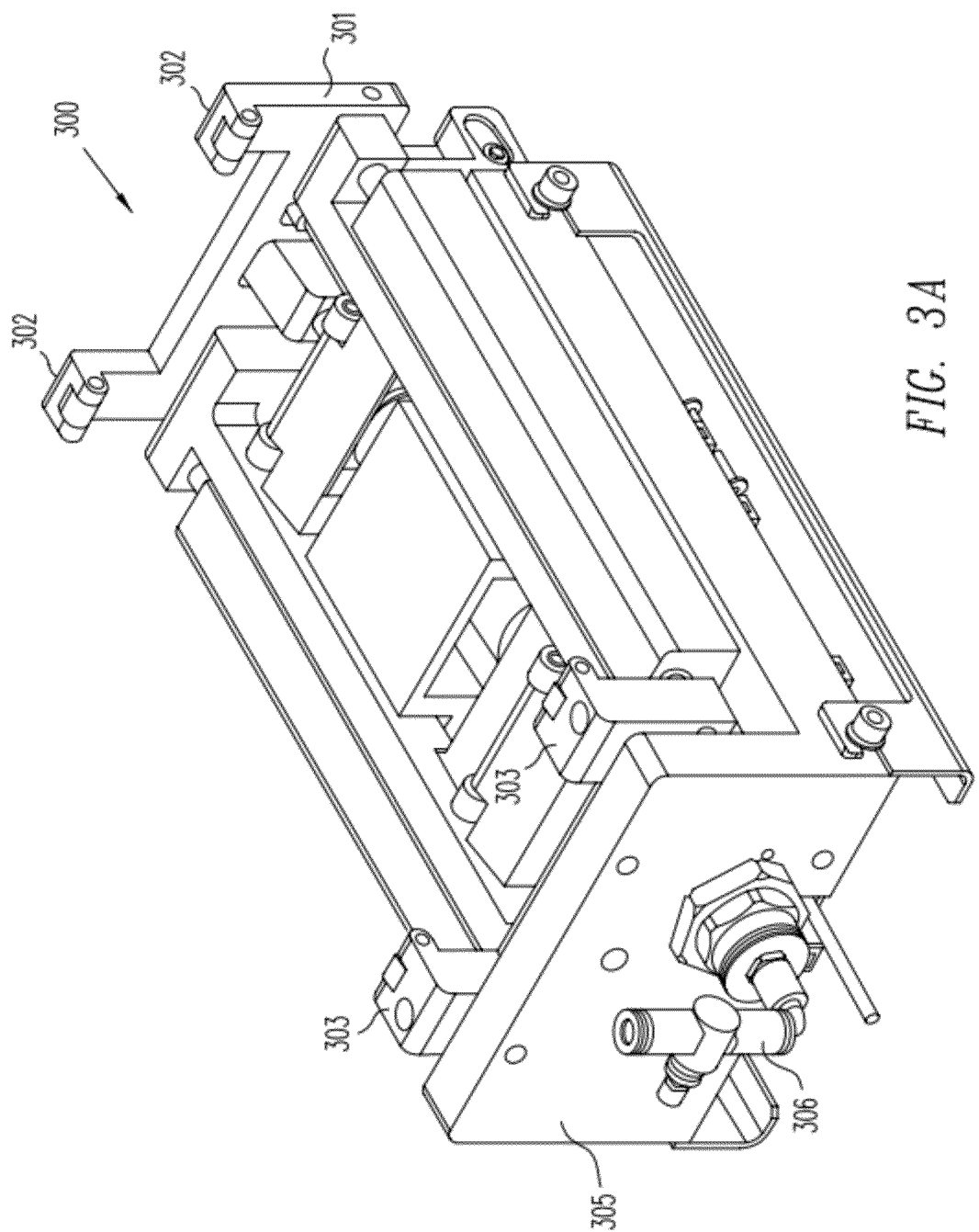
FIGS. 3A and 3B illustrate two different views of an exemplary embodiment of a PCS gripper assembly.
Figure 3B:
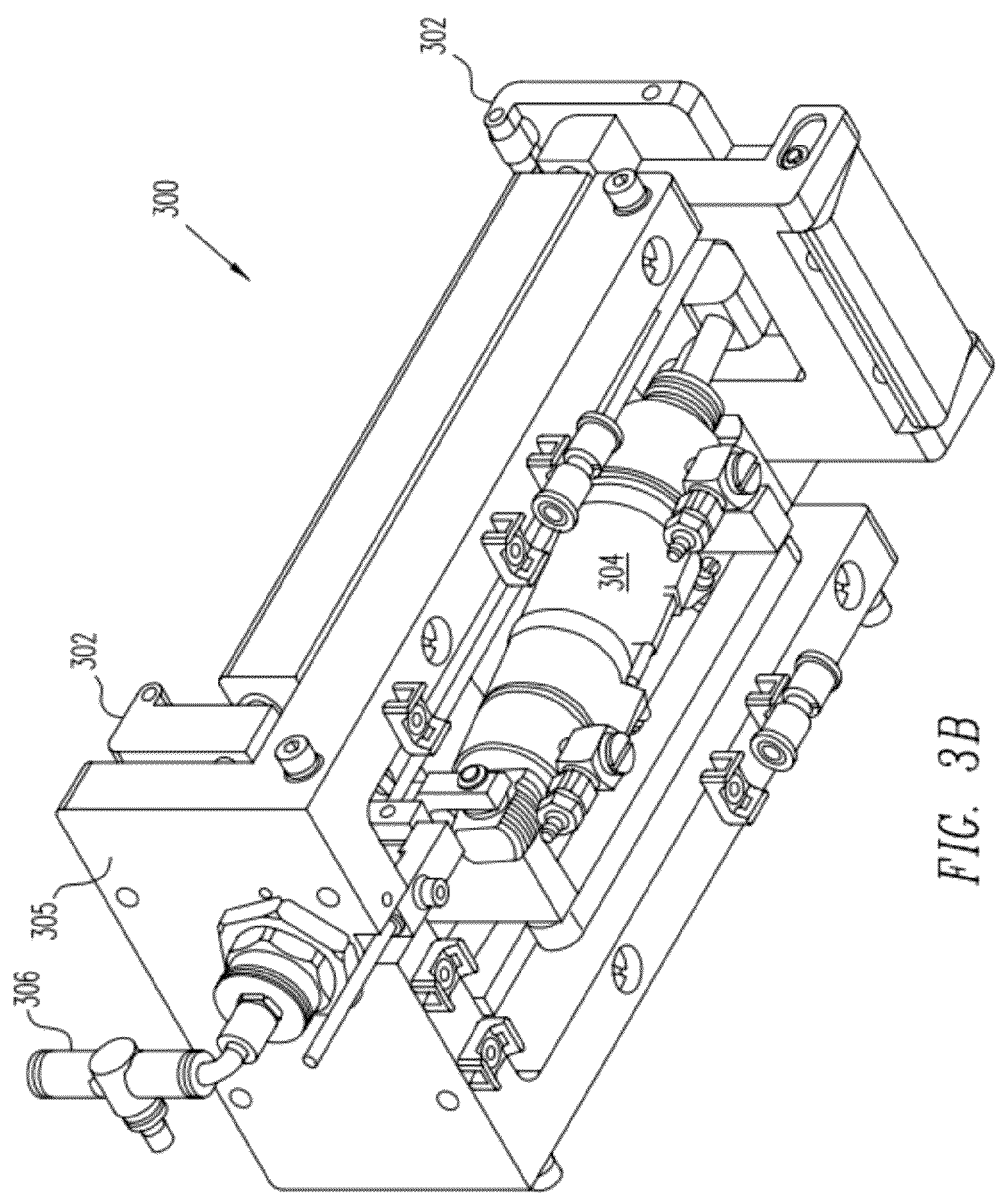

In accordance with one or more embodiments of the inventive concept, the PCS robot 101 uses a highly integrated mechanism, PCS gripper assembly 300, an exemplary embodiment of which is illustrated in FIGS. 3A and 3B. The PCS gripper assembly 300 is used to "pick and place" the probe assemblies 102 to and from the storage racks 103 and the probe gantry 104. The PCS gripper assembly 300 incorporates the gripping arm 301, which is pivotally movable in relation to the remainder of the PCS gripper assembly 300 and is actuated using, for example, a pneumatic cylinder (not shown). When the gripping arm 301 is engaged, it is designed to open the probe assembly clamping mechanism and to grab the body of the probe assembly 102. The gripping fingers 302 and 303 are designed to facilitate the retaining of the probe assembly 102 in the gripper assembly 300 during the repositioning operation. When the gripping arm 301 disengages, the probe assembly 102 clamping mechanism automatically closes and the probe assembly 102 is released from the PCS gripper assembly 300.

In accordance with one or more embodiments of the inventive concept, the gripper assembly 300 incorporates an integrated mechanical linkage that facilitates opening and closing of the gripper fingers 302 and 303 by actuation of the gripper pneumatic cylinder. This enables the gripper fingers 302 to establish a secure grip on the probe assembly 102. In the same or other embodiments, the aforesaid integrated mechanical linkage also enables raising and lowering of a lever to open/close the probe assembly 102 clamping mechanism.

In accordance with one or more embodiments of the inventive concept, the gripper assembly 300 incorporates a banking cylinder 306, which operates to bank or retract a gripped the probe assembly 102 onto/or from the probe bar gantry 104 or the storage rack 103.

In accordance with one or more embodiments of the inventive concept, during the aforesaid pick and place operation the following sequential operations are performed by the PCS gripper assembly 300 in a single stroke of the aforesaid pneumatic cylinder actuating the gripping arm 301: grabbing the probe assembly 102, opening and closing the probe assembly clamping mechanism and retracting and extending the full array contactor. The probe assembly's clamping mechanism facilitates attaching thereof to the storage racks 103 and/or probe bar gantry 104. In one or more embodiments of the invention, the PA is banked by means of the banking cylinder 306 of the gripper assembly 300 against the probe bar gantry 104 or the storage rack 103 for consistent alignment of the contacts of the probe assembly 102 with the traces of the PCB Bus 203. In one or more embodiments, both the probe bar gantry 104 and the storage rack 103 have tightly controlled banking and clamping surfaces.

In one or more embodiments, the probe assembly 102 incorporates an integrated mechanical linkage that facilitates opening and closing of clamps in order to clamp and unclamp onto the probe bar gantry 104 or the storage rack 103 and to raise or lower the contacts of the probe assembly 102 for making electrical contact to the traces of the PCB Bus 203.

Figure 4:
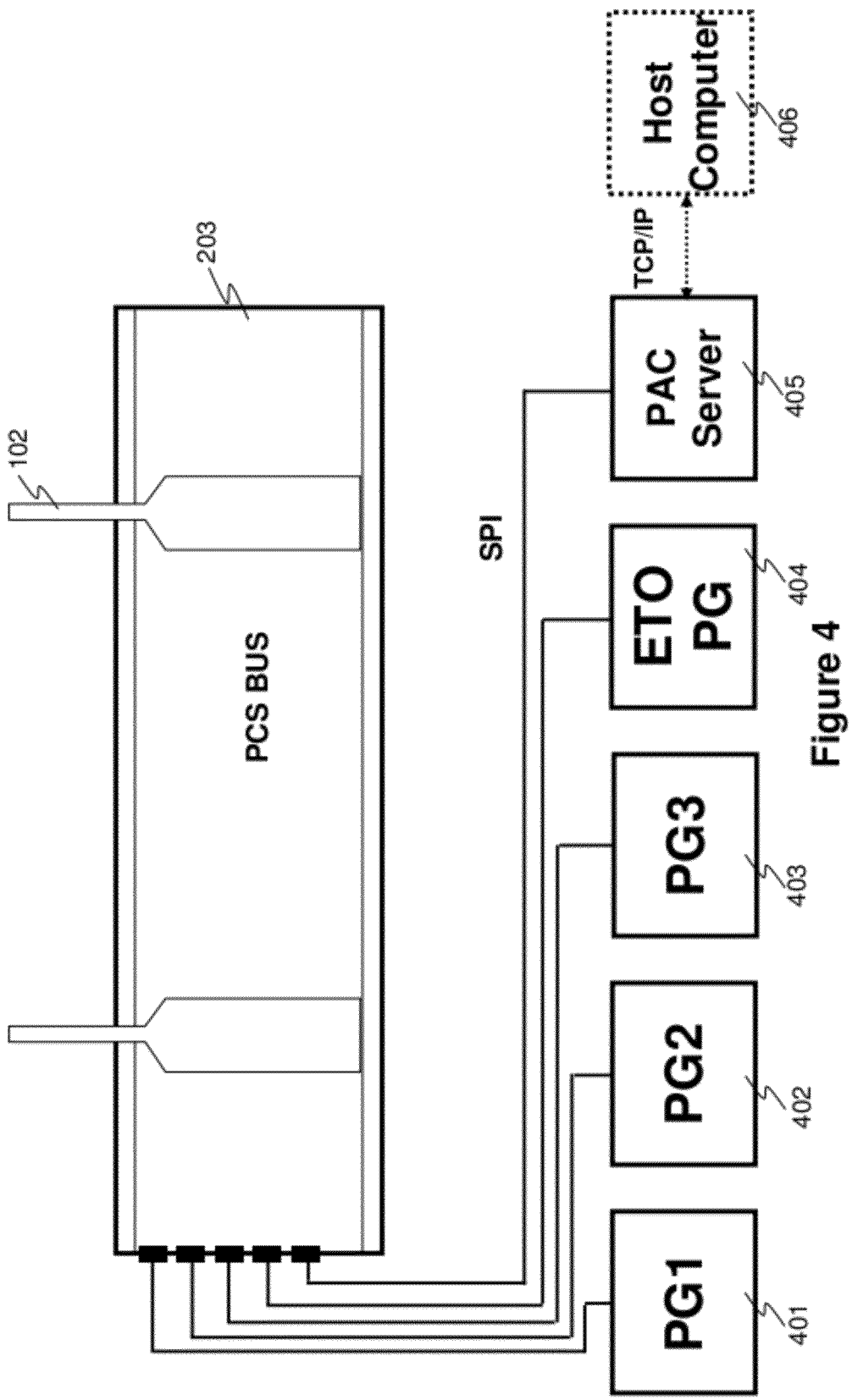
FIG. 4 illustrates an exemplary configuration with multiple pattern generators delivering groups of driving pattern signals through a PCS bus.

In accordance with one or more embodiments of the inventive concept, the probe bar gantry 104 incorporates, at least in part, a rigid gantry structure 107 where the probe assemblies 102 are placed, and a PCB Bus 203 (FIG. 2) with an array of lengthwise conductive traces so that electrical signals can be fed to the probe assemblies 102 regardless of their position along the probe bar gantry 104, as illustrated in FIG. 4.

In accordance with one or more embodiments of the inventive concept, in order to excite the driving circuits on the LCD glass or other DUT for electrical inspection, one or more of electrical test signals is generated in one or more of the pattern generators 401-404 of the inventive electrical testing system, see FIG. 4. As illustrated in FIG. 4, the aforesaid one or more electrical test signals are routed to the PCS Bus 203 on the probe bar gantry 104. The probe assemblies receive the electrical signal from the PCS bus 203 through the contacts 201 of the full array contactor 204 of the probe assembly 102. The electrical circuit is completed when the electrical signal is passed to the LCD glass or other DUT through the probing pins of the probe assemblies 102 appropriately positioned on the probe bar gantry 104.

Figure 5:
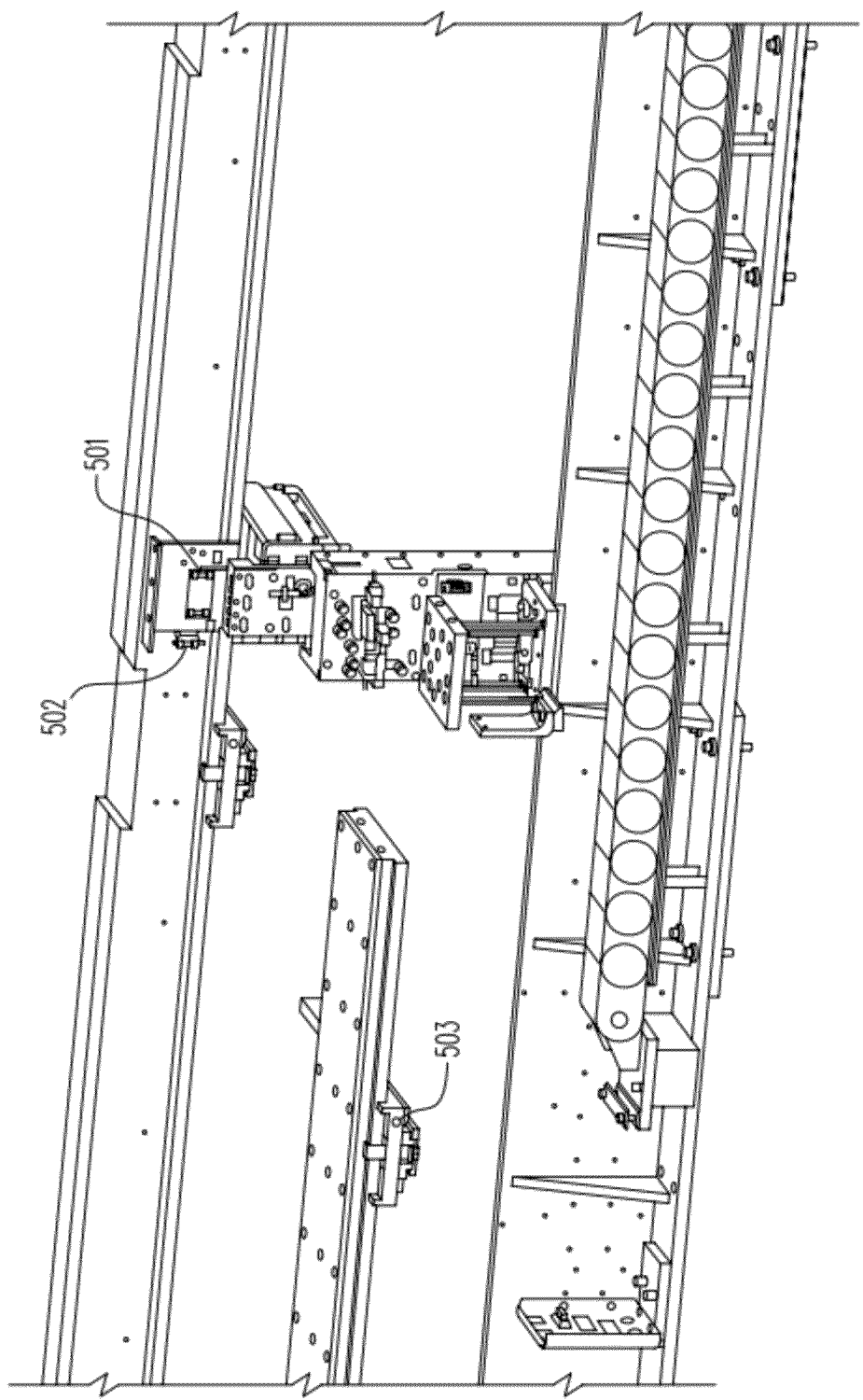
FIG. 5 illustrates an RFID read/write system and an edge detection sensor utilized in an embodiment of the inventive PCS.

In accordance with one or more embodiments of the inventive concept, in order to keep track of the locations, configurations and/or other information associated with the probe assemblies 102 and to locate probe assemblies on the rack 103 or probe bar gantry 104, the PCS robot 101 is outfitted with an RFID read/write system 501 and an edge detection sensor 502, as shown in FIG. 5. Each probe assembly 102 has an RFID tag 503 that can be read from or written to by the robot's RFID read/write system 501. The RFID tag 503 stores a unique probe assembly ID, probe type, and an XY offset calibration, in addition to other relevant parameters. Any other devices such as cameras, illumination, lasers, other sensors (wired/wireless) for alignment, metrology, energy transfer, heat transfer to substrate and the like, can be added to embodiments of the inventive system at run time. In one or more embodiments of the invention, the inventive system also incorporates a probe assembly 102 presence sensor (not shown in FIG. 5), which operates to detect the presence or absence of a probe assembly 102 on the gripper assembly 300 for fault free re-configuration.

In one or more embodiments of the invention, the edge detection sensor 502 of the PCS robot 101 can be used for software compensation in vertical direction for compensating against any flatness or distortions of the surface of the probe bar gantry 104 in order to facilitate fault free exchange of the probe assemblies. In one or more embodiments, an innovative software algorithm detects unique probe assemblies on the probe bar gantry 104 by driving signals to and from PAC looking for PAC ID inside each probe assembly on the PCB Bus 203. This algorithm detects shorts, if any, on the PCB Bus 203 and locates the probe assembly that has been misplaced.

In one or more embodiments of the invention, a probe pin tester module mounted behind the tiled chuck is used to detect any missing or broken pins on the probe assembly's nose, thus saving the time necessary for probing of the DUT. A probe assembly mounted on the probe bar gantry 104 is driven on top of the probe pin tester module and the probe pins come down on the pin tester plate after which a software algorithm completes electrical circuit across each pin to detect any missing or broken pins.

Figure 6:
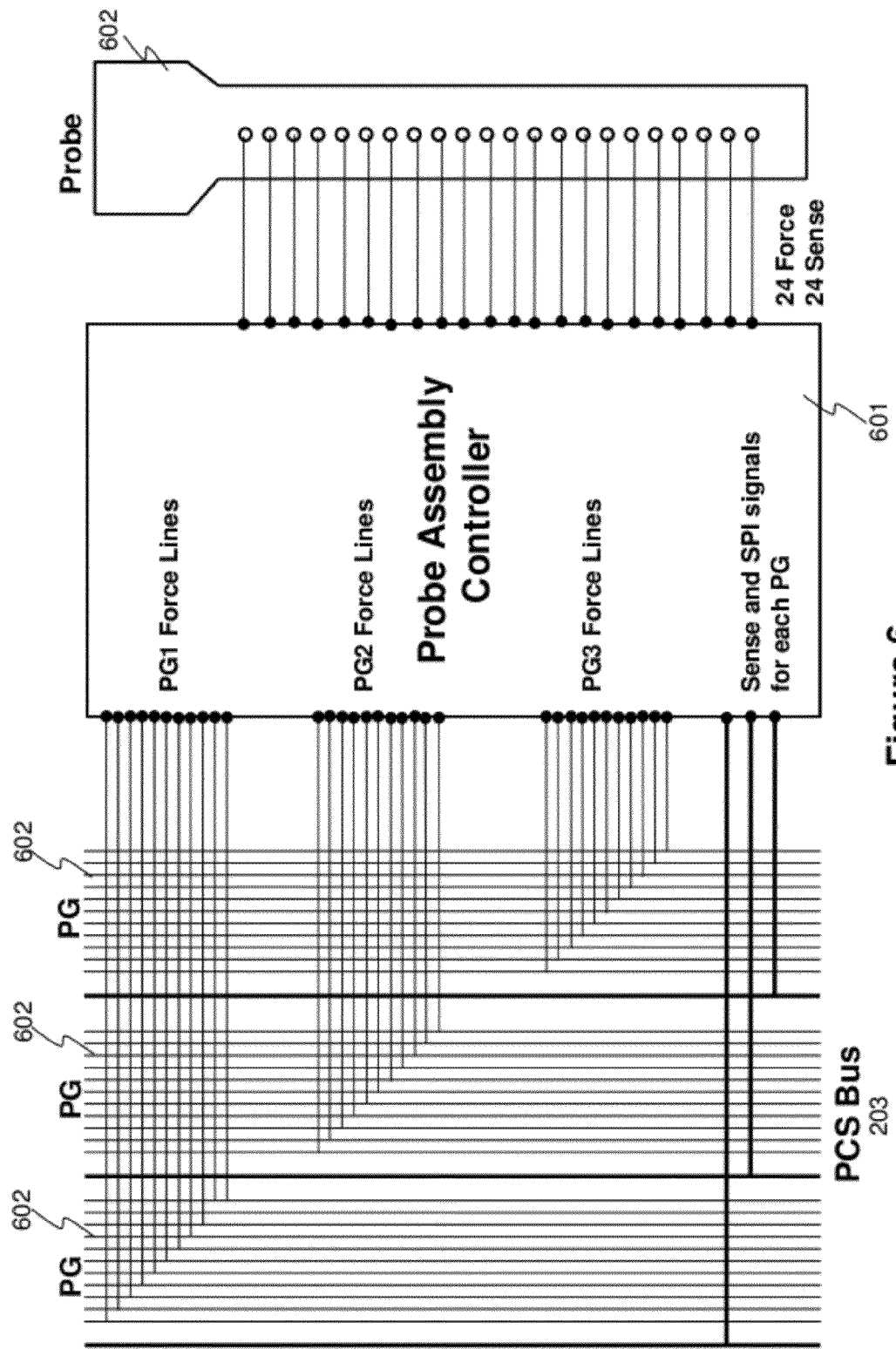
FIG. 6 illustrates an exemplary embodiment of a schematic of interconnection between PCS bus board, probe assembly controller (PAC) and probe nose.

In accordance with one or more embodiments of the inventive concept, the electrical stimulus signal for electrical array inspection is provided by multiple independent driving channels with a sensing capability. These signals are configured and applied to the panel by probe assembly controller (PAC) 601, which may be disposed on the probe assembly 102, as schematically illustrated in FIG. 6. In accordance with one or more embodiments of the inventive concept, multiple aforesaid probe assembly controllers 601 may be controlled by a host computer 406 through the PAC server 405. The PAC server 405 translates the high level instructions from the host computer to signals for the probe assembly controllers 601. The probe assembly controllers 601 are addressed by the PAC server 405 using, for example, unique identifiers stored in a non-volatile memory of the probe assembly controllers 601.

In accordance with one or more embodiments of the inventive concept, the primary function of the aforesaid probe assembly controller 601 is to enable configurable pin assignment among a number of groups of driving channels so that the electrical stimulus can be applied to any LCD or other DUT pad layout. In various embodiments of the invention, the host computer 406 to PAC 601 communication is achieved via serial protocol interface (SPI) with, for example, RS485 signal as physical layer (single master, multiple slaves). However, as it would be appreciated by those of skill in the art, the invention is not limited to any specific communication protocol and other suitable protocols may be utilized. In one or more embodiments, this communication may be performed through the PAC server 405, as illustrated in FIG. 4.

In accordance with one or more embodiments of the inventive concept, the LCD panel or other DUT driving pattern is generated from one or more remote pattern generators 401-404. In various embodiments, a single channel of pattern is defined as a series of electrical pulses with amplitude ranging between predetermined values, for example, plus and minus 50 volts.

Figure 7:
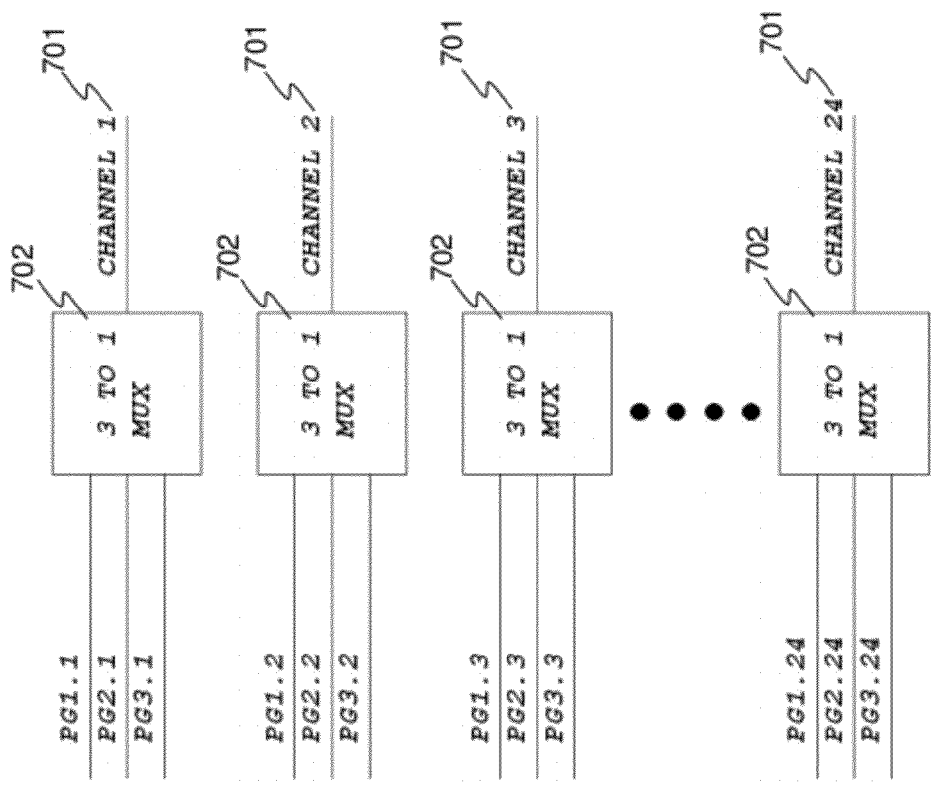
FIG. 7 illustrates an exemplary embodiment of a switching bank of driving channels.

In accordance with one or more embodiments of the inventive concept, there are provided one or more groups 602 of driving channels that can be input into a single PAC 601. The PAC 601 then multiplexes each driving channel PG1.1-PG3.24 through a relay switching matrix comprised of, for example, 3 to 1 multiplexers 702 to any individual driving pin 701 at the probe nose of the probe assembly 102, as shown in FIG. 7. The PAC 601 uses a SPI interface to obtain commands, such as switching, ID programming and the like, from the PAC server 405. In various embodiments, each PAC has a unique ID that is stored, for example, in a non-volatile memory device so that it can be addressed individually. The aforesaid ID can be reprogrammed through the same SPI interface.

In one or more embodiments of the inventive concept, the inventive PAC system is provided with a field-programmable gate array (FPGA), which is configured to provide the SPI interface operable to parse the commands and control a complex multiplexer matrix for routing test electric signals. In one exemplary implementation, the aforesaid system may be implemented using, for example, solid state relays.

Figure 8:
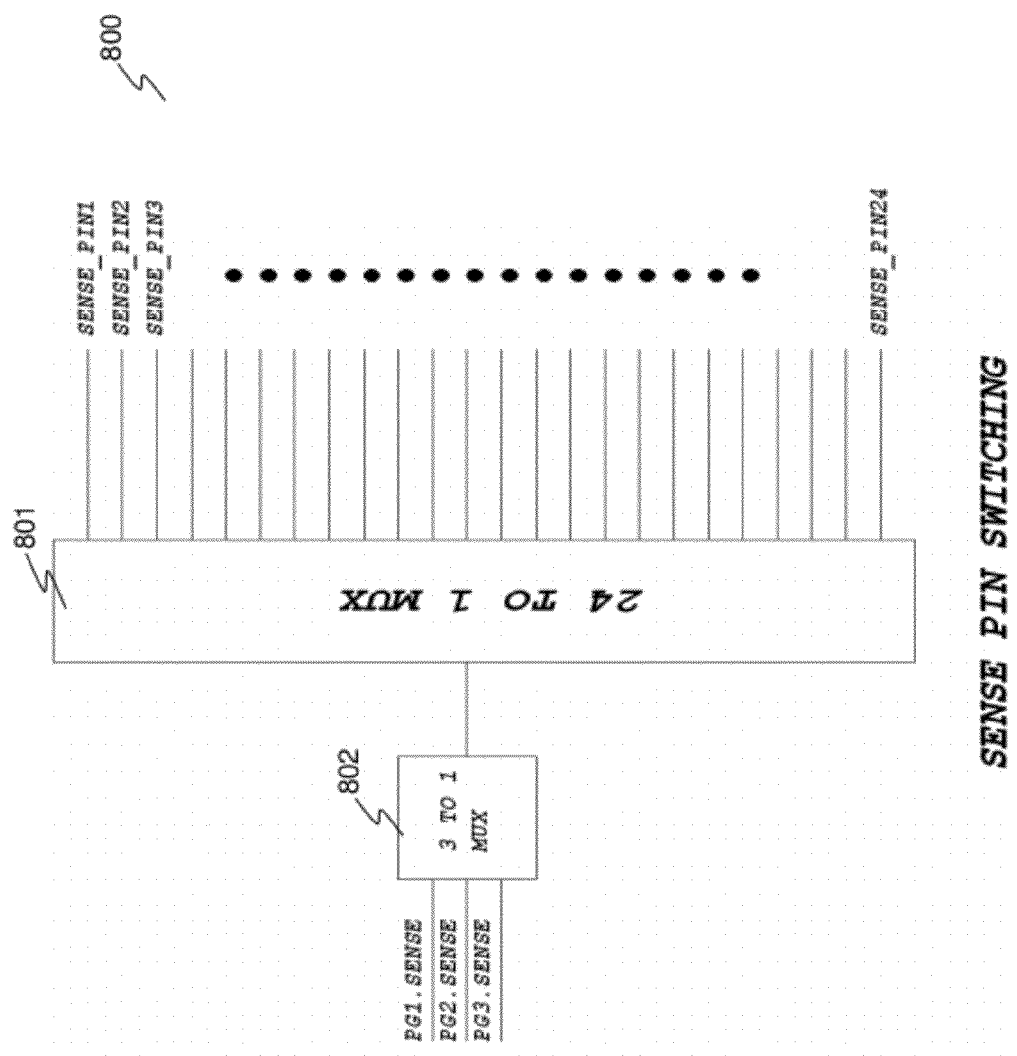
FIG. 8 illustrates an exemplary embodiment of a sense pin and sense channel switching architecture.

In addition to the aforesaid drive channels, the inventive system additionally includes multiple electrical signal sense channels configured to facilitate electrical measurements during panel or other DUT inspection. In one or more embodiments, a switching matrix similar to the switching matrix for the drive channels described above is provided for the sense channel to enable sense pin switching. An exemplary embodiment of such switching matrix 800 is illustrated in FIG. 8. In the illustrated implementation, a flexible pin assignment control utilizes 3 to 1 multiplexer 802 and 24 to 1 multiplexer 801 to achieve substantial flexibility of channel assignment, allowing any channel PG1.SENSE-PG3.SENSE to be routed to any pin SENSE_PIN1-SENSE_PIN24.

Figure 9:
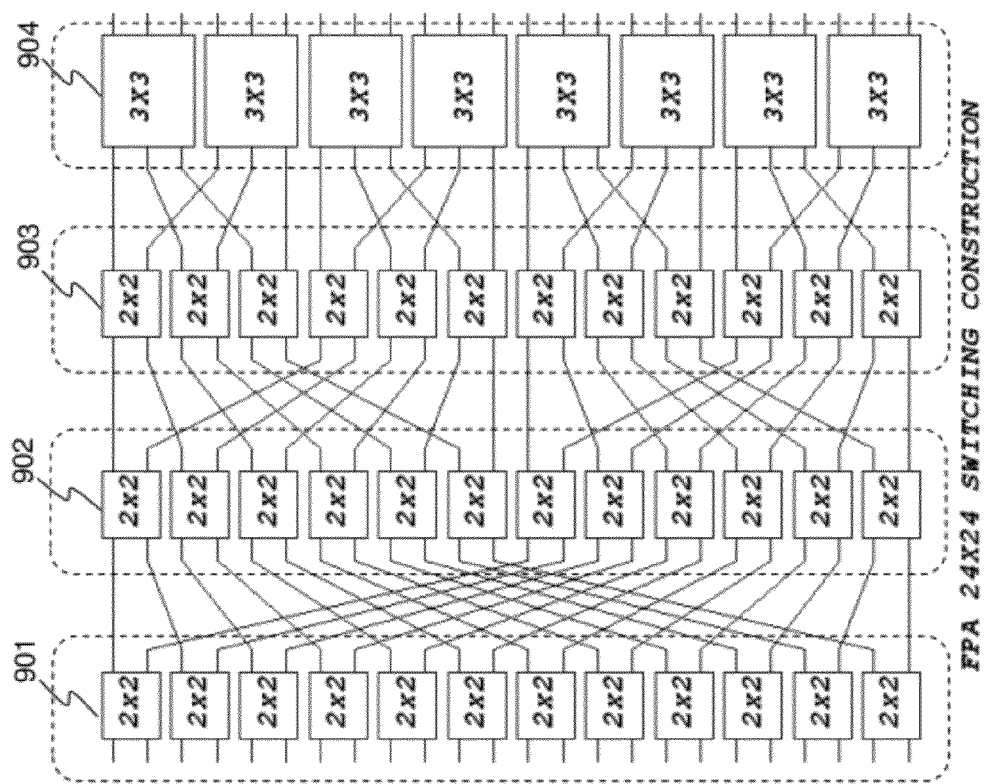
FIG. 9 illustrates an exemplary embodiment of a 24×24 switching architecture facilitating flexible pin assignment

FIG. 9 illustrates one exemplary implementation of the aforesaid flexible pin assignment control mechanism. The pin control is achieved using four layers 901, 902, 903 and 904 of 2 to 2 and 3 to 3 multiplexers, well known to persons of skill in the art. As it would be appreciated by those of skill in the art, the inventive concept is not limited to the implementation of the switching matrix illustrated in FIG. 9 and other suitable implementations could be used to achieve the same purpose of flexible force or sense pin assignment.

In accordance with one or more embodiments of the inventive concept, the system may also include (in addition to the robot and the (first) gantry described above, which are located at the front of the system) a second robot positioned at the rear of the system. Also located at the rear is an access area, such as a window or another opening, and a second movable gantry, which can be accessed by the human operator of the system or by any automated means through the access area. The second movable gantry may also be repositioned (by going over the (first) gantry) such that it can be accessible by the (first, front) robot system. This front robot system is configured to reposition the payload among any of the storage rack, the first gantry assembly and the second gantry assembly. One or more edge detection sensors configured to identify and locate the payload by detecting edges of the payload may be provided.

Loading a probe assembly on the storage rack or the (first) gantry may involve the following steps:
Second robot (rear) stationary in default location;
Operator manually loading the probe assembly on the second gantry (rear) through the access area;
The second gantry (rear) moving on top of the (first) robot (front) which then picks up the probe assembly; and
The (first) robot (front) storing the probe assembly on the storage rack (front) or the (first) gantry (front).
The unloading procedure can be accomplished in the opposite order.

As it would be appreciated by those of skill in the art, the advantages of the inventive PCS system described herein include the reduced downtime for product change, reduced cost for adopting the electrical inspection system for testing new products, as well as reduced exposure of operators to safety hazards.

It should be noted that the inventive procedure and associated mechanism for remotely (and/or automatically) reconfiguring probing structures to conform to the configuration of the DUT is not limited to any specific testing device or any specific testing system or method. The described concepts may be used in testing of LCD or OLED panels as well as any other electronic devices using any known testing technique, including electron beam, voltage imaging or any other now known or later developed testing technique. Moreover, the inventive system is not limited to handling of only probe assemblies or specific test equipment and may be utilized to handle any payload, including, without limitation, cameras, sensors or any other equipment, whether testing or otherwise.

Finally, it should be understood that processes and techniques described herein are not inherently related to any particular apparatus and may be implemented by any suitable combination of components. Further, various types of general purpose devices may be used in accordance with the teachings described herein. It may also prove advantageous to construct specialized apparatus to perform the method steps described herein. The present invention has been described in relation to particular examples, which are intended in all respects to be illustrative rather than restrictive.

Moreover, other implementations of the invention will be apparent to those skilled in the art from consideration of the specification and practice of the invention disclosed herein. Various aspects and/or components of the described embodiments may be used singly or in any combination in the system for testing of electronic devices. It is intended that the specification and examples be considered as exemplary only, with a true scope and spirit of the invention being indicated by the following claims.

What is claimed is:

1. A probe system for inspection of a device under test, the probe system comprising:
 a. a storage rack;
 b. a probe bar gantry assembly;
 c. a probe assembly configured to electrically mate the device under test; and
 d. a robot system configured to pick the probe assembly from the storage rack and deliver the probe assembly to the probe bar gantry, the robot system being further configured to pick a probe assembly from the probe bar gantry and deliver the probe assembly to the storage rack, wherein the probe assembly comprises a contact assembly comprising a plurality of contacts, wherein the probe bar gantry assembly comprises a gantry structure and an electrical bus mounted on the gantry structure, the electrical bus comprising a plurality of traces and wherein the plurality of contacts of the contact assembly are configured to electrically mate with the plurality of traces of the electrical bus when the probe assembly is installed on the probe bar gantry assembly.

2. The probe system of claim 1, wherein the probe assembly comprises a clamping assembly configured to attach the probe assembly to the probe bar gantry or the storage rack.

3. The probe system of claim 1, wherein the probe assembly comprises an array of contact pins configured to mate with conductive pads on the device under test when the probe assembly is installed on the probe bar gantry assembly.

4. The probe system of claim 1, further comprising a controller configured to detect a predetermined probe assembly on the electrical bus.

5. The probe system of claim 4, wherein the controller is further configured to verify presence of correct probe assemblies in the electrical bus and identify any misplaces probe assemblies.

6. The probe system of claim 1, further comprising a test pattern generator configured to generate an electrical test pattern for the device under test, wherein the test pattern generator is electrically connected to the electrical bus of the probe bar gantry assembly such that the electrical test pattern is applied to at least one of the plurality of contacts of the contact assembly through the traces of the electrical bus.

7. The probe system of claim 6, wherein the probe assembly is configured to receive the test pattern from the electrical bus through the contact assembly and to apply the electrical test pattern to the device under test through the array of contact pins.

8. The probe system of claim 1, wherein the plurality of traces of the electrical bus are arranged along the length of the probe bar gantry assembly such that the plurality of contacts of the contact assembly of the probe assembly mate with the plurality of traces of the electrical bus when the probe assembly is installed anywhere along the length of the probe bar gantry assembly.

9. The probe system of claim 1, wherein the probe bar gantry is configured to provide an automated axis of motion for positioning the probe assembly at a specific location on the device under test.

10. The probe system of claim 1, wherein the robot system comprises a gripping assembly operable to grab the probe assembly.

11. The probe system of claim 10, wherein the gripping assembly comprises a gripping arm pivotally movable in relation to the gripping device and wherein the robot system comprises an actuator for actuating the gripping arm of the gripping assembly.

12. The probe system of claim 10, wherein the probe assembly comprises a clamping assembly configured to attach the probe assembly to the probe bar gantry or the storage rack and wherein the gripping assembly is operable to cause the clamping assembly of the probe assembly to open and release the storage rack or the probe bar gantry assembly when the probe assembly is grabbed by the gripping assembly.

13. The probe system of claim 1, wherein the robot system comprises at least one sensor configured to identify and locate probe assemblies.

14. The probe system of claim 13, wherein the sensor is a RFID reader and wherein the probe assembly comprises an RFID tag configured to be read by the RFID reader and wherein the RFID tag stores at least one of: a unique probe assembly identifier, probe type information, and calibration information.

15. The probe system of claim 13, wherein the sensor is an edge detection sensor configured to detect an edge of the probe assembly.

16. The probe system of claim 15, further comprising a controller configured to determine corrections necessary for compensating for any distortion of the probe bar gantry assembly surface during placement or removal of the probe assembly.

17. The probe system of claim 1, wherein the probe assembly comprises an array of contact pins configured to mate with conductive pads on the device under test, a contact assembly comprising a plurality of contacts and a probe assembly controller configured to route one or more signals from one or more of the plurality of contacts to one or more contact pins.

18. A probe system for inspection of a device under test, the probe system comprising:
 a. a storage rack;
 b. a probe bar gantry assembly;
 c. a probe assembly configured to electrically mate the device under test; and
 d. a robot system configured to pick the probe assembly from the storage rack and deliver the probe assembly to the probe bar gantry, the robot system being further configured to pick a probe assembly from the probe bar gantry and deliver the probe assembly to the storage rack, wherein the probe assembly comprises an array of contact pins configured to mate with conductive pads on the device under test, a contact assembly comprising a plurality of contacts and a probe assembly controller configured to route one or more signals from one or more of the plurality of contacts to one or more contact pins and wherein the probe assembly controller comprises a serial protocol interface coupled to the contact assembly, the contact assembly being configured to electrically mate with an electrical bus of the probe bar gantry assembly, such that the serial protocol interface is controllable through the electrical bus of the probe bar gantry assembly using a serial protocol.

19. The probe system of claim 18, further comprising a probe assembly controller server operable to send serial protocol commands to the serial protocol interface of the probe assembly through the electrical bus.

20. The probe system of claim 17, further comprising a plurality of test pattern generators configured to generate a plurality of groups of electrical test pattern signals for the device under test, wherein the contact assembly is configured to electrically mate with an electrical bus of the probe bar gantry assembly, wherein the plurality of groups of electrical test pattern signals are applied to the electrical bus and wherein the probe assembly controller is configured to route one of the plurality of groups of electrical test pattern signals to the plurality of contact pins.

21. The probe system of claim 17, wherein the probe assembly controller is configured to route one or more sensed signals from the device under test from one or more contact pins to one or more of the plurality of contacts of the contact assembly.

22. The probe system of claim 17, wherein the probe assembly controller of the probe assembly comprises a memory device storing a unique identifier of the probe assembly and wherein the unique identifier of the probe assembly is used to send commands to the probe assembly controller.

23. The probe system of claim 17, wherein the probe assembly controller is configured to route a signal from any one of the plurality of contacts to any one of the plurality of contact pins.

24. The probe system of claim 17, wherein the contact pins of the probe assembly are pre-positioned according to a configuration of a predetermined device under test.

25. The probe system of claim 1, wherein the probe assembly comprises at least one of: an optical probing device, an electrical probing device, a thermal probing device and an alignment probing device.

26. The probe system of claim 1, wherein the probe bar gantry assembly is operable to position the probe assembly anywhere on the device under test.

27. A probe system for inspection of a device under test, the probe system comprising:
   a. a storage rack comprising a first rail;
   b. a probe bar gantry assembly comprising gantry structure and an electrical bus attached to the gantry structure and having a plurality of traces, the gantry structure comprising a second rail;
   c. a probe assembly comprising a plurality of pins configured to electrically mate contact pads on the device under test, a plurality of contacts configured to mate the traces of the electrical bus when the probe assembly is positioned on the probe bar gantry assembly and a clamping assembly configured to engage the first rails and second rails; and
   d. a robot system configured to pick the probe assembly from the storage rack and deliver the probe assembly to the probe bar gantry, the robot being further configured to pick the probe assembly from the probe bar gantry and deliver the probe assembly to the storage rack.

* * * * *